US011443681B2

(12) United States Patent
Kim et al.

(10) Patent No.: US 11,443,681 B2
(45) Date of Patent: Sep. 13, 2022

(54) GATE DRIVER AND DISPLAY APPARATUS INCLUDING THE SAME

(71) Applicant: SAMSUNG DISPLAY CO., LTD., Yongin-si (KR)

(72) Inventors: Cholho Kim, Seoul (KR); Gunwoo Yang, Seoul (KR); Hyunyoung Choi, Seoul (KR); Jihoon Yang, Seoul (KR); Yongwoo Lee, Gimpo-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 374 days.

(21) Appl. No.: 15/412,691

(22) Filed: Jan. 23, 2017

(65) Prior Publication Data

US 2017/0249893 A1    Aug. 31, 2017

(30) Foreign Application Priority Data

Feb. 29, 2016   (KR) .......................... 10-2016-0024645

(51) Int. Cl.
*G09G 3/20*    (2006.01)
*G09G 3/3266*    (2016.01)
(Continued)

(52) U.S. Cl.
CPC ......... *G09G 3/2092* (2013.01); *G09G 3/3266* (2013.01); *G09G 3/3677* (2013.01); *G11C 19/28* (2013.01); *G09G 3/296* (2013.01); *G09G 3/3659* (2013.01); *G09G 2310/0286* (2013.01); *G09G 2310/08* (2013.01); *G09G 2320/0223* (2013.01)

(58) Field of Classification Search
CPC .... G09G 3/296; G09G 3/3266; G09G 3/3283; G09G 3/3659; G09G 3/3674; G09G 3/3677; G09G 3/3681; G09G 2310/02–0221; G09G 2310/0289; G09G 2310/0291; G09G 3/2092; G09G 2310/0286; G09G 2310/08; G09G 2320/0223; G11C 19/28
See application file for complete search history.

(56) References Cited

U.S. PATENT DOCUMENTS 7,907,113 B2 *    3/2011    Jang ..................... G09G 3/3607
                                                377/64
2012/0105398 A1*    5/2012    Park ............... H03K 19/018521
                                                345/206
(Continued)

FOREIGN PATENT DOCUMENTS

KR    1020140120178    10/2014
KR    1020150006724    1/2015
(Continued)

*Primary Examiner* — William Boddie
*Assistant Examiner* — Saifeldin E Elnafia
(74) *Attorney, Agent, or Firm* — F. Chau & Associates, LLC

(57) ABSTRACT

A gate driver according to an exemplary embodiment of the present inventive concept includes a pull-up-pull-down circuit configured to pull up a gate signal to a high level of a first clock signal in a first duration and configured to pull down the gate signal to a low level of the first clock signal in a second duration, and a pull-down boosting circuit configured to output a first off voltage to the pull-up-pull-down part in the second duration in response to a second clock signal.

19 Claims, 6 Drawing Sheets

(51) Int. Cl.
  *G11C 19/28* (2006.01)
  *G09G 3/36* (2006.01)
  *G09G 3/296* (2013.01)

(56) References Cited

U.S. PATENT DOCUMENTS

| | | | | |
|---|---|---|---|---|
| 2013/0335392 | A1* | 12/2013 | Cho | G11C 19/28 345/211 |
| 2014/0092078 | A1* | 4/2014 | Yoon | G09G 3/3696 345/212 |
| 2014/0098013 | A1* | 4/2014 | Chen | G09G 3/3677 345/92 |
| 2015/0339997 | A1* | 11/2015 | Yang | G11C 19/28 345/212 |
| 2016/0240129 | A1* | 8/2016 | Kim | G09G 3/3266 |

FOREIGN PATENT DOCUMENTS

| | | |
|---|---|---|
| KR | 1020150030541 | 3/2015 |
| KR | 1020150086771 | 7/2015 |
| KR | 1020150086973 | 7/2015 |

* cited by examiner

GATE DRIVER AND DISPLAY APPARATUS INCLUDING THE SAME

CROSS-REFERENCE TO RELATED APPLICATION

This application claims priority under 35 U.S.C. § 119 to Korean Patent Application No. 10-2016-0024645, filed on Feb. 29, 2016 in the Korean Intellectual Property Office (KIPO), the disclosure of which is incorporated by reference in its entirety herein.

BACKGROUND

1. Technical Field

Exemplary embodiments of the present inventive concept relate generally to display devices, and more particularly to gate drivers and display apparatuses including the gate drivers.

2. Discussion of the Related Art

Generally, a display apparatus includes a display panel and a panel driver. The display panel includes a plurality of gate lines and a plurality of data lines. The panel driver includes a gate driver providing gate signals to the gate lines and a data driver providing data voltages to the data lines.

The gate driver includes a plurality of switching elements. The switching elements are controlled by clock signals, and generate the gate signals. If the clock signals are delayed due to an RC delay, the gate signals become delayed and each of the gate signals may be output at different times to each of the gate lines.

SUMMARY

At least one exemplary embodiment of the present inventive concept provide a gate driver capable of improving display quality.

At least one exemplary embodiment of the present inventive concept provides a display apparatus including the gate driver.

A gate driver according to an exemplary embodiment of the present inventive concept includes a pull-up-pull-down circuit configured to pull up a gate signal to a high level of a first clock signal in a first duration and configured to pull down the gate signal to a low level of the first clock signal in a second duration, and a pull-down boosting circuit configured to output a first off voltage to the pull-up-pull-down part in the second duration in response to a second clock signal.

In an exemplary embodiment, the first off voltage is a DC voltage.

In an exemplary embodiment, a level of the first off voltage is substantially the same as the low level of the first clock signal.

In an exemplary embodiment, the second clock signal is the first clock signal inverted.

In an exemplary embodiment, the gate driver further comprises a pull-up-pull-down control circuit configured to control an operation of the pull-up-pull-down circuit in response to a previous carry signal and a next carry signal. The pull-up-pull-down circuit, the pull-down boosting circuit, and the pull-up-pull-down control circuit form a current stage of the gate driver. The previous carry signal is output by a previous stage of the gate driver that is located before the current stage. The next carry signal is output by a next stage of the gate driver that is located after the current stage. The previous stage and the next stage include the same elements as the current stage.

In an exemplary embodiment, the pull-up-pull-down circuit comprises a first transistor, and the first transistor comprises a first control electrode connected to the pull-up-pull-down control circuit, a first input electrode configured to receive the first clock signal, and a first output electrode configured to output the gate signal.

In an exemplary embodiment, the pull-down boosting circuit comprises a second transistor, and the second transistor comprises a second control electrode configured to receive the second clock signal, a second input electrode configured to receive the first off voltage, and a second output electrode connected to the first input electrode.

In an exemplary embodiment, the first off voltage is commonly applied to every stage.

A gate driver according to an exemplary embodiment of the present inventive concept includes a pull-up circuit configured to pull up a gate signal to a high level of a first clock signal in a first duration, a pull-down circuit configured to pull down the gate signal to a first off voltage in a second duration in response to a next carry signal output by a next stage, an inverting circuit configured to generate an inverting signal based on the first clock signal and a second off voltage, and a pull-down boosting circuit configured to output the second off voltage to the pull-up part in the second duration in response to a previous inverting signal output by a previous stage.

In an exemplary embodiment, the second off voltage is a DC voltage.

In an exemplary embodiment, the inverting signal of the previous stage has a low level during the first duration and has a high level during the second duration.

A display apparatus according to an exemplary embodiment of the present inventive concept includes a data driver configured to generate a data voltage based on input image data, a gate driver comprising a pull-up-pull-down circuit configured to pull up a gate signal to a high level of a first clock signal in a first duration and configured to pull down the gate signal to a low level of the first clock signal in a second duration, and a pull-down boosting circuit configured to output a first off voltage to the pull-up-pull-down circuit in the second duration in response to a second clock signal, and a display panel configured to display an image based on the data voltage and the gate signal.

In an exemplary embodiment, the first off voltage is a DC voltage.

In an exemplary embodiment, a level of the first off voltage is substantially the same as the low level of the first clock signal.

In an exemplary embodiment, the second clock signal is the first clock signal inverted.

In an exemplary embodiment, the gate driver further comprises a pull-up-pull-down control circuit configured to control an operation of the pull-up-pull-down circuit in response to a previous carry signal of a previous stage and a next carry signal of one of next stages.

In an exemplary embodiment, the pull-up-pull-down circuit comprises a first transistor, and the first transistor comprises a first control electrode connected to the pull-up-pull-down control circuit, a first input electrode configured to receive the first clock signal, and a first output electrode configured to output the gate signal.

In an exemplary embodiment, the pull-down boosting circuit comprises a second transistor, and the second transistor comprises a second control electrode configured to receive the second clock signal, a second input electrode configured to receive the first off voltage, and a second output electrode connected to the first input electrode.

In an exemplary embodiment, the first off voltage is commonly applied to every stage.

A display apparatus according to an exemplary embodiment of the inventive concept includes a display panel, a timing controller, and a gate driver. The timing controller is configured to provide a clock signal and an off voltage at a low level of the clock signal. The gate driver is configured to provide a gate signal to the display panel. Each comprises a first transistor and a second transistor. The first transistor is configured to pull up the gate signal to a high level of the clock signal in a first duration and configured to pull down the gate signal to the low level in a second duration. The second transistor is configured to output the off voltage to the first transistor in the second duration in response to an inverted version of the clock signal.

In an embodiment, a second stage among the stages includes a third transistor comprising a control electrode and an input electrode commonly connected to a previous carry terminal receiving a previous carry signal output from a first stage among the stages, and a fourth transistor comprising a control electrode connected to a next carry terminal receiving a next carry signal output from a third stage among the stages, and an input terminal receiving a second off voltage at a level lower than the first off voltage, where an output electrode of the third transistor is connected to an output terminal of the fourth transistor.

In an embodiment, the second stage further comprises a fifth transistor including an input electrode receiving the first clock signal and a capacitor including a first terminal connected to a control terminal of the fifth transistor and a second terminal connected to a current carry terminal outputting a current carry signal.

In an embodiment, the second stage further comprises a sixth transistor including an input node receiving the first clock signal and an output node connected to a gate output terminal outputting the gate signal.

According to at least one exemplary embodiment, when a pull-up-pull-down transistor performs both pull-up and pull-down in a gate driver, a DC voltage having a low level is applied to the transistor in a pull-down duration to reduce a falling delay of a gate signal. This can also be applied when there are a pull-up transistor and a pull-down transistor separately. Thus, display quality of a display panel can be improved.

BRIEF DESCRIPTION OF THE DRAWINGS

The present inventive concept will become more apparent by describing in detail exemplary embodiments thereof with reference to the accompanying drawings, in which.

DETAILED DESCRIPTION OF THE EMBODIMENTS

Figure 1:
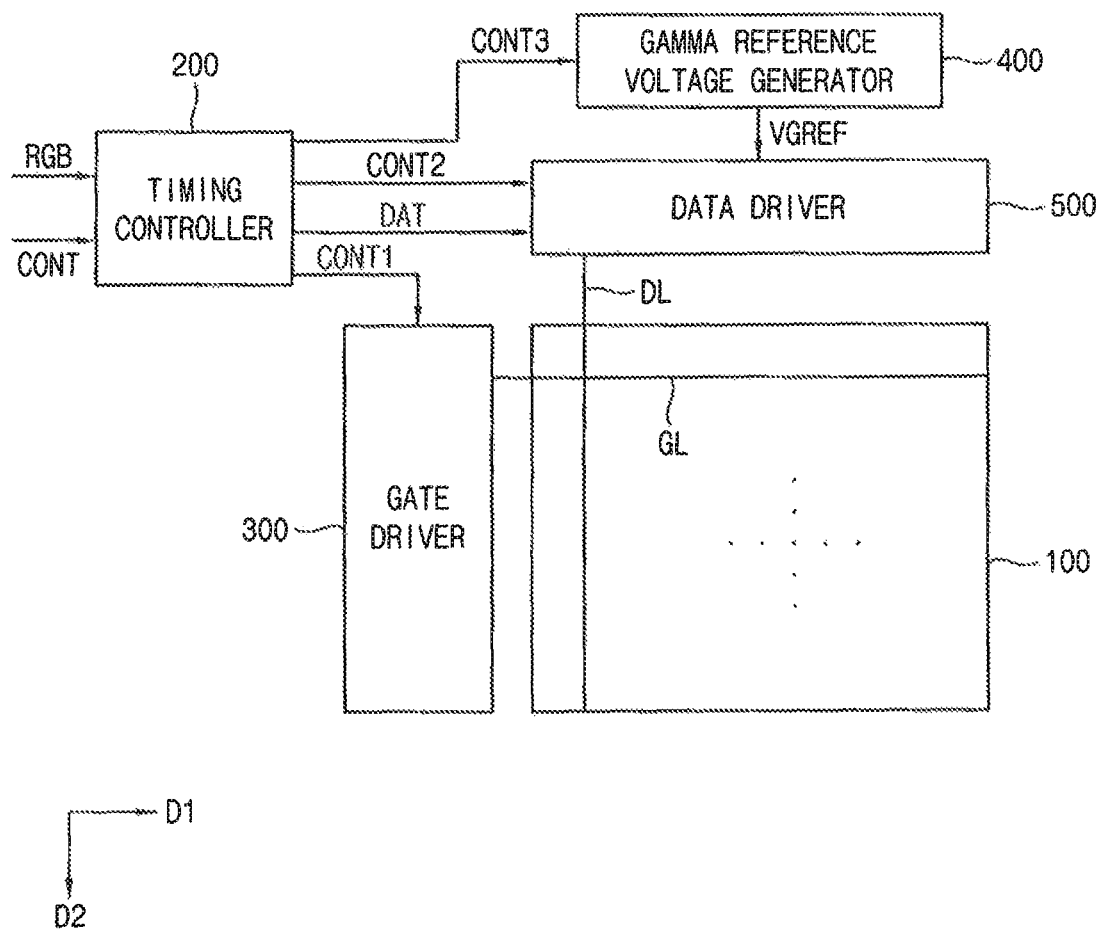
FIG. 1 is a block diagram illustrating a display apparatus according to an exemplary embodiment of the inventive concept.

Hereinafter, the present inventive concept will be explained in detail with reference to the accompanying drawings. This inventive concept may, however, be embodied in many different forms and should not be construed as limited to the embodiments set forth herein. Like reference numerals refer to like elements throughout this application. As used herein, the singular forms, "a," "an" and "the" are intended to include the plural forms as well, unless the context clearly indicates otherwise.

FIG. 1 is a block diagram illustrating a display apparatus according to an exemplary embodiment of the inventive concept.

Referring to FIG. 1, the display apparatus includes a display panel 100 and a panel driver. The panel driver includes a timing controller 200, a gate driver 300, a gamma reference voltage generator 400 and a data driver 500.

The display panel 100 includes a display region for displaying an image and a peripheral region adjacent to the display region.

The display panel 100 includes a plurality of gate lines GL, a plurality of data lines DL and a plurality of pixels electrically connected to the gate lines GL and the data lines DL. The gate lines GL extend in a first direction D1 and the data lines DL extend in a second direction D2 crossing the first direction D1.

In an exemplary embodiment, the pixels include a switching element (e.g., a switching transistor), a liquid crystal capacitor and a storage capacitor. The switching transistor may be a thin film transistor. The liquid crystal capacitor and the storage capacitor may be electrically connected to the switching element. The pixels may be arranged in a matrix configuration.

The timing controller 200 receives input image data RGB and an input control signal CONT from an external device (not shown). The input image data RGB may include red image data R, green image data G and blue image data B. The input control signal CONT may include a master clock signal and a data enable signal. The input control signal CONT may further include a vertical synchronizing signal and a horizontal synchronizing signal.

The timing controller 200 generates a first control signal CONT1, a second control signal CONT2, a third control signal CONT3 and a data signal DAT based on the input image data RGB and the input control signal CONT.

The timing controller 200 generates the first control signal CONT1 for controlling operations of the gate driver 300 based on the input control signal CONT, and outputs the first control signal CONT1 to the gate driver 300. The first control signal CONT1 may include a vertical start signal and a gate clock signal.

The timing controller 200 generates the second control signal CONT2 for controlling operations of the data driver 500 based on the input control signal CONT, and outputs the second control signal CONT2 to the data driver 500. The second control signal CONT2 may include a horizontal start signal and a load signal.

The timing controller 200 generates the data signal DAT based on the input image data RGB. The timing controller 200 outputs the data signal DAT to the data driver 500. The data signal DAT may be substantially the same image data as the input image data RGB or the data signal DAT may be compensated image data generated by compensating the input image data RGB. For example, the timing controller 200 may selectively perform an image quality compensation, a spot compensation, an adaptive color correction (ACC), and/or a dynamic capacitance compensation (DCC) on the input image data RGB to generate the data signal DAT.

The timing controller 200 generates the third control signal CONT3 for controlling operations of the gamma reference voltage generator 400 based on the input control signal CONT, and outputs the third control signal CONT3 to the gamma reference voltage generator 400.

The gate driver 300 generates gate signals for driving the gate lines GL in response to the first control signal CONT1 received from the timing controller 200. The gate driver 300 sequentially outputs the gate signals to the gate lines GL.

In some exemplary embodiments, the gate driver 300 may be directly mounted on the display panel 100, or may be connected to the display panel 100 as a tape carrier package (TCP) type. Alternatively, the gate driver 300 may be integrated on the peripheral region of the display panel 100.

The gate driver 300 will be explained in detail with reference to FIGS. 2, 3A, 3B, 4A and 4B.

The gamma reference voltage generator 400 generates a gamma reference voltage VGREF in response to the third control signal CONT3 received from the timing controller 200. The gamma reference voltage generator 400 outputs the gamma reference voltage VGREF to the data driver 500. The level of the gamma reference voltage VGREF corresponds to grayscales of a plurality of pixel data included in the data signal DAT.

In some exemplary embodiments, the gamma reference voltage generator 400 may be disposed in the timing controller 200, or may be disposed in the data driver 500.

The data driver 500 receives the second control signal CONT2 and the data signal DAT from the timing controller 200, and receives the gamma reference voltage VGREF from the gamma reference voltage generator 400. The data driver 500 converts the data signal DAT to data voltages having analogue levels based on the gamma reference voltage VGREF. For example, the data signal DAT may have digital levels. The data driver 500 outputs the data voltages to the data lines DL.

In some exemplary embodiments, the data driver 500 may be directly mounted on the display panel 100, or may be connected to the display panel 100 as a tape carrier package (TCP) type. Alternatively, the data driver 500 may be integrated on the peripheral region of the display panel 100.

Figure 2:
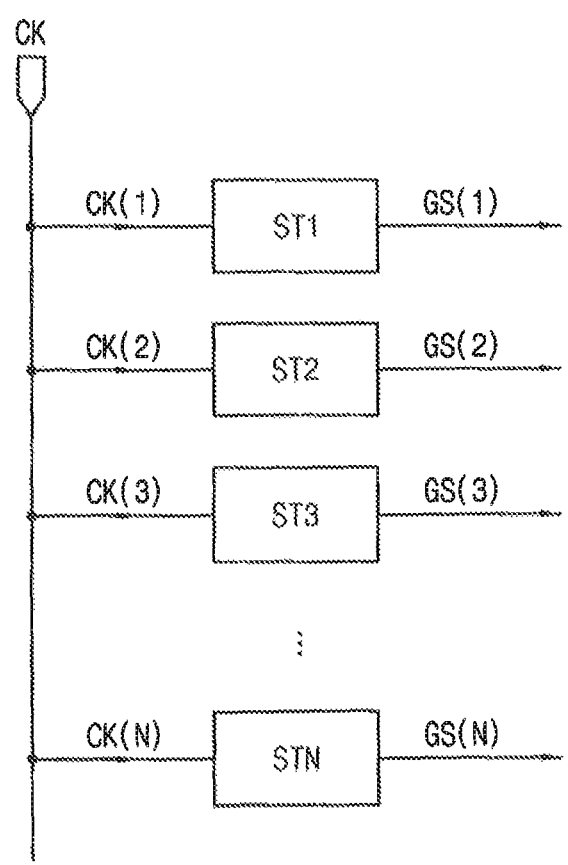
FIG. 2 is a block diagram illustrating a plurality of stages included in a gate driver according to an exemplary embodiment of the inventive concept.

FIG. 2 is a block diagram illustrating a plurality of stages included in a gate driver according to an exemplary embodiment of the inventive concept. The gate driver of FIG. 2 may be used to implement the gate driver 300 of FIG. 1.

Referring to FIGS. 1 and 2, the gate driver 300 includes first through N-th stages ST1, ST2, ST3, . . . , STN. The first through N-th stages ST1~STN receive clock signals CK(1), CK(2), CK(3), . . . , CK(N). The first through N-th stages ST1~STN output gate signals GS(1), GS(2), GS(3), . . . , GS(N) based on the clock signals CK(1)~CK(N).

Figure 3A:
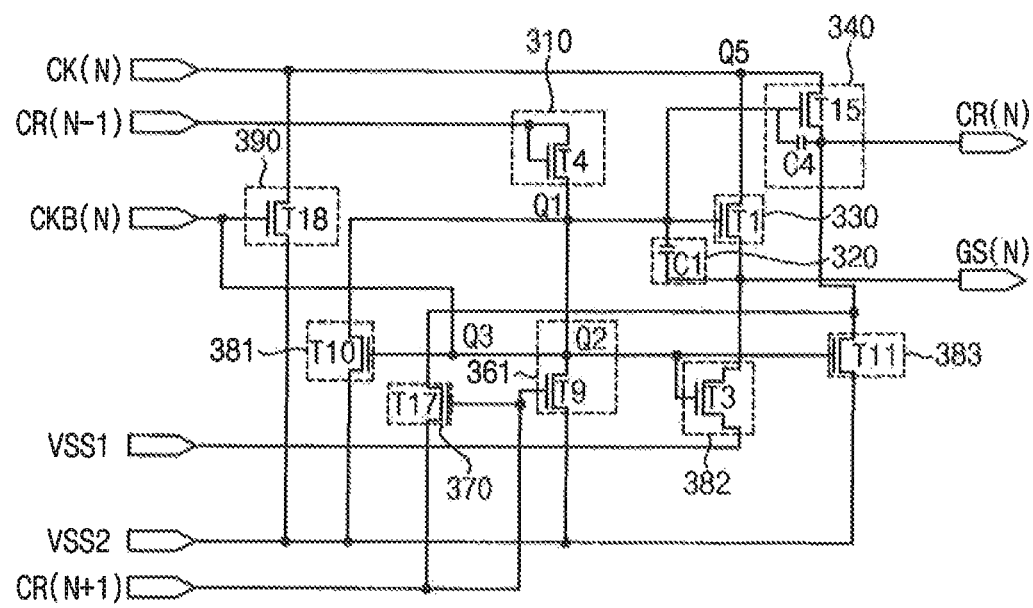
FIG. 3A is a circuit diagram illustrating one example of an N-th stage included in a gate driver according to an exemplary embodiment of the inventive concept.
Figure 4A:
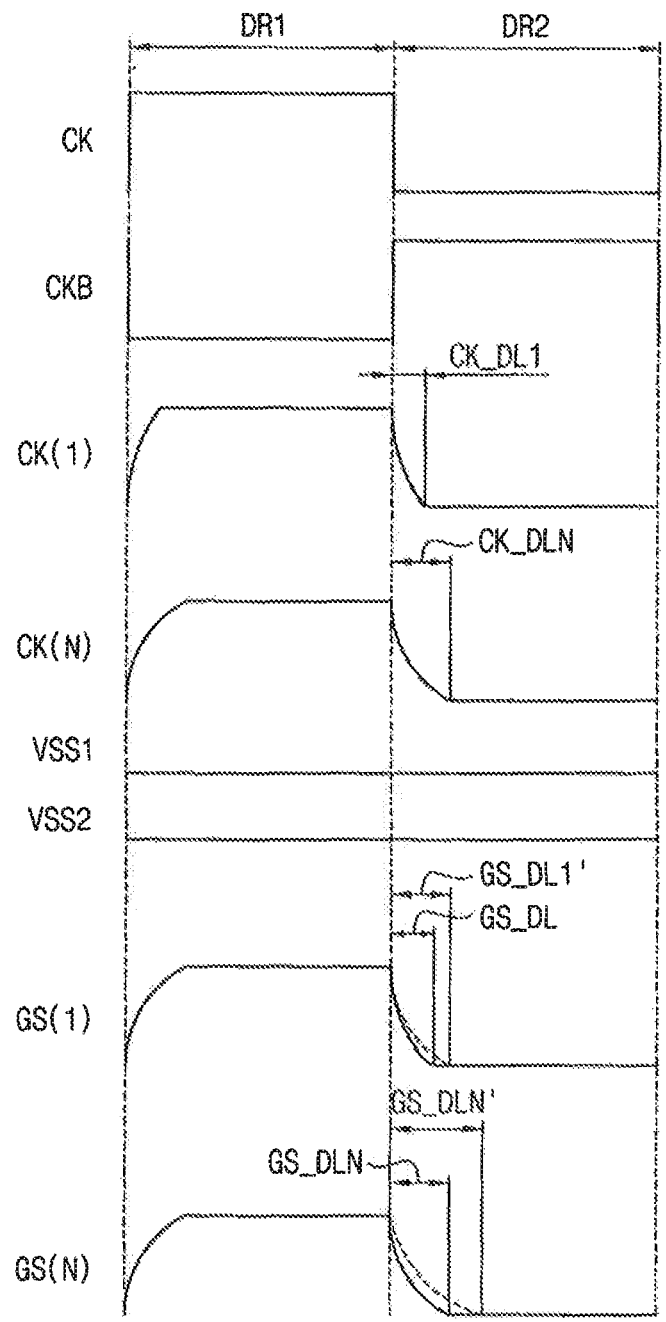
FIGS. 4A and 4B are timing diagrams illustrating input signals and output signals of an N-th stage included in a gate driver according to an exemplary embodiment of the inventive concept.

FIG. 3A is a circuit diagram illustrating one example of an N-th stage included in a gate driver according to an exemplary embodiment of the inventive concept. FIG. 4A is a timing diagram illustrating input signals and output signals of an N-th stage included in a gate driver according to an exemplary embodiment of the inventive concept. FIG. 3A is a circuit diagram illustrating one example of the N-th stage included in the gate driver in FIG. 2, and FIG. 4A is a timing diagram illustrating input signals and output signals in FIG. 3A.

Referring to FIGS. 1, 2, 3A and 4A, the N-th stage STN of the gate driver 300 receives a first clock signal CK(N), a second clock signal CKB(N), a first off voltage VSS1 and a second off voltage VSS2. The N-th stage outputs a gate signal GS(N).

The first clock signal CK(N) is applied to a first clock terminal. The second clock signal CKB(N) is applied to a second clock terminal. The first off voltage VSS1 is applied to a first off terminal. The second off voltage VSS2 is applied to a second off terminal. The gate signal GS(N) is outputted from a gate output terminal.

The first clock signal CK(N) is a square wave having a high level and a low level that alternate. For example, the first clock signal CK(N) has the high level during a first duration DR1 and has the low level during a second duration DR2. In an embodiment, the high level of the first clock signal CK(N) is a gate-on voltage and the low level of the first clock signal CK(N) is a gate-off voltage. The gate-on voltage may be used to apply a data voltage to a pixel in a given row of the display panel 100. In an embodiment, the low level of the first clock signal CK(N) is substantially the same as the second off voltage VSS2. In an embodiment, a duty ratio of the high level of the first clock signal CK(N) is 50%. In an alternate embodiment, the duty ratio of the high level of the first clock signal CK(N) is less than 50%. The first clock signal CK(N) may be applied to the first clock terminal or the second clock terminal of odd stages or even stages of the gate driver 300. For example, the gate-on voltage may be about 15 V through 20 V.

The second clock signal CKB(N) is a square wave having a high level and a low level that alternate. For example, the second clock signal CKB(N) has the low level during the first duration DR1 and may have the high level during the second duration DR2. The high level of the second clock signal CKB(N) may be the gate-on voltage The low level of the second clock signal CKB(N) may be substantially the same as the second off voltage VSS2. In an embodiment, a duty ratio of the high level of the second clock signal CKB(N) is 50%. In an alternate embodiment, the duty ratio of the high level of the second clock signal CKB(N) is less than 50%. The second clock signal CKB(N) may be applied to the first clock terminal or the second clock terminal of odd stages or even stages of the gate driver 300. For example, when the first clock signal CK(N) is applied to the first clock terminal of the odd stages, the second clock signal CKB(N) is applied to the first clock terminal of the even stages. Alternatively, when the first clock signal CK(N) is applied to the first clock terminal of the even stages, the second clock signal CKB(N) is applied to the first clock terminal of the odd stages. For example, the second clock signal CKB(N) may be the first clock signal CK(N) inverted. For example, the second clock signal CKB(N) may be generated by passing the first clock signal CK(N) through an inverter circuit.

In an embodiment, the first off voltage VSS1 is a direct current (DC) voltage. In an embodiment, the second off voltage VSS2 is a DC voltage. In an embodiment, the second off voltage VSS2 has a lower level than the first off voltage VSS1. For example, the first off voltage VSS1 may be about −5 V. For example, the second off voltage VSS2 may be about −10 V.

The N-th stage STN outputs a gate signal GS(N) and an N-th carry signal CR(N) in response to an (N−1)-th carry signal CR(N−1) of an (N−1)-th stage that is a previous stage.

Similarly, the first through N-th stages ST1~STN output each gate signal sequentially.

The (N−1)-th carry signal CR(N−1) is applied to an (N−1)-th carry terminal. The (N+1)-th carry signal CR(N+1) is applied to an (N+1)-th carry terminal. The N-th carry signal CR(N) is outputted from an N-th carry terminal.

The N-th stage STN includes a pull-up-pull-down control part (e.g., a pull-up/pulldown control circuit), a charging part 320 (e.g., a charging circuit), a pull-up-pull-down part 330 (e.g., a pull-up/pulldown circuit), a carry part 340 (e.g., a carry circuit), a carry stabilizing part 370 (e.g., a carry stabilizing circuit), a second holding part 382 (e.g., a second holding circuit), a third holding part (e.g., a third holding circuit) 383 and a pull-down boosting part (e.g., a pull-down boosting circuit) 390. The pull-up-pull-down control part includes a pull-up control part (e.g., a pull-up control circuit) 310, a pull-down part 361 (e.g., a pull-down circuit) and a first holding part (e.g., a first holding circuit) 381.

The pull-up control part 310 includes a fourth transistor T4. The fourth transistor T4 includes a control electrode and an input electrode commonly connected to the (N−1)-th carry terminal, and an output electrode connected to a first node Q1. The first node Q1 is connected to a control electrode of the pull-up part 330.

The charging part 320 includes a charging capacitor C1. The charging capacitor C1 includes a first electrode connected to the first node Q1 and a second electrode connected to the gate output terminal that outputs the gate signal GS(N).

The pull-up-pull-down part 330 includes a first transistor T1. The first transistor T1 includes a control electrode connected to the first node Q1, an input electrode connected to a fifth node Q5 and an output electrode connected to the gate output terminal. The fifth node Q5 receives a first clock signal CK(N) from the first clock terminal.

The carry part 340 includes a fifteenth transistor T15 and a fourth capacitor C4. The fifteenth transistor T15 includes a control electrode connected to the first node Q1, an input electrode connected to the first clock terminal and an output electrode connected to the N-th carry terminal. The fourth capacitor C4 includes a first electrode connected to the first node Q1 and a second electrode connected to the N-th carry terminal.

The pull-down part 361 includes a ninth transistor T9. The ninth transistor T9 includes a control electrode connected to the (N+1)-th carry terminal, an input electrode connected to the second off terminal and an output electrode connected to a second node Q2.

The carry stabilizing part 370 includes a seventeenth transistor T17. The seventeenth transistor T17 includes a control electrode and an input electrode commonly connected to the (N+1)-th carry terminal, and an output electrode connected to the N-th carry terminal.

The carry stabilizing part 370 reduces a noise due to a leakage current transmitted through a fourth transistor T4 of the (N+1)-th stage.

The first holding part 381 includes a tenth transistor T10. The tenth transistor T10 includes a control electrode connected to the third node Q3, an input electrode connected to the second off terminal and an output electrode connected to the first node Q1.

The second holding part 382 includes a third transistor T3. The third transistor T3 includes a control electrode connected to the third node Q3, an input electrode connected to the first off terminal and an output electrode connected to the gate output terminal.

The third holding part 383 includes an eleventh transistor T11. The eleventh transistor T11 includes a control electrode connected to the third node Q3, an input electrode connected to the second off terminal and an output electrode connected to the N-th carry terminal.

The pull-down boosting part 390 includes an eighteenth transistor T18. The eighteenth transistor T18 includes a control electrode connected to the second clock terminal, an input electrode connected to the second off terminal and an output electrode connected to the fifth node Q5.

In the present exemplary embodiment, although the (N−1)-th carry signal is used as a previous carry signal, the previous carry signal is not limited to the (N−1)-th carry signal. The previous carry signal may be a carry signal of any one of the previous stages. In addition, although the (N+1)-th carry signal is used as a next carry signal, the next carry signal is not limited to the (N+1)-th carry signal. The next carry signal may be a carry signal of any one of the next stages.

In an exemplary embodiment, the transistors are oxide semiconductor transistors. In an alternate embodiment, the transistors are amorphous silicon transistors.

A gate signal GS(N) of the N-th stage STN is synchronized with the first clock signal CK(N), and has a high level corresponding to the N-th stage STN. The N-th carry signal CR(N) is synchronized with the first clock signal CK(N), and has a high level corresponding to the N-th stage STN.

A voltage of the first node Q1 of the N-th stage STN is increased to a first level corresponding to the (N−1)-th stage by the pull-up control part 310. The voltage of the first node Q1 of the N-th stage STN is increased to a second level, which is higher than the first level, corresponding to the N-th stage STN by the pull-up-pull-down part 330 and the charging part 320. The voltage of the first node Q1 of the N-th stage STN is decreased corresponding to the (N+1)-th stage by the pull-down part 361.

Accordingly, the first transistor T1 is turned on during the first and second durations DR1, DR2. Thus, the gate signal GS(N) is pulled up to the high level of the first clock signal CK(N) during the first duration DR1, and is pulled down to the low level of the first clock signal CK(N) during the second duration DR2.

A first clock signal CK(1) applied to the first stage ST1 is delayed by a first clock falling delay CK_DL1 due to an RC delay. The N-th clock signal CK(N) applied to the N-th stage STN is delayed by an N-th clock falling delay CK_DLN due to the RC delay. The RC delay is longer at a bottom part of the gate driver 300 than at a top part of the gate driver 300, so the N-th clock falling delay CK_DLN is longer than the first clock falling delay CK_DL1.

If the N-th clock falling delay CK_DLN is longer than the first clock falling delay CK_DL1, an N-th gate falling delay GS_DLN' of a gate signal GS(N) of the N-th stage STN is also longer than a first gate falling delay GS_DL1' of a gate signal GS(1) of the first stage ST1.

According to an exemplary embodiment, the pull-up-pull-down part 330 pulls up the gate signal GS(N) to the high level of the first clock signal CK(N) in the first duration DR1, and pulls down the gate signal GS(N) to the low level of the first clock signal CK(N) in the second duration DR2. The pull-down boosting part 390 outputs the second off voltage VSS2 to the fifth node Q5 in the second duration DR2 in response to the second clock signal CKB(N).

For example, CR(N−1) input to the second stage ST2 is the CR(1) carry signal output by the first stage ST1 and CR(N+1) input to the second stage ST2 is the CR(3) carry signal output by the third stage ST3.

Figure 3B:
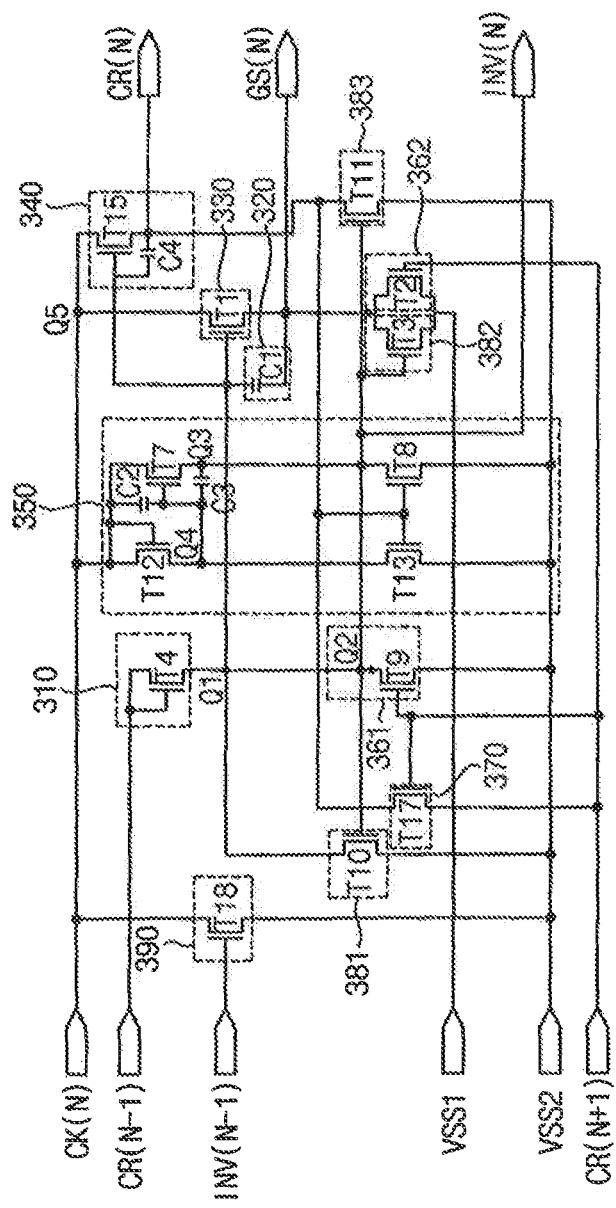
FIG. 3B is a circuit diagram illustrating another example of an N-th stage included in a gate driver according to an exemplary embodiment of the inventive concept.
Figure 4B:
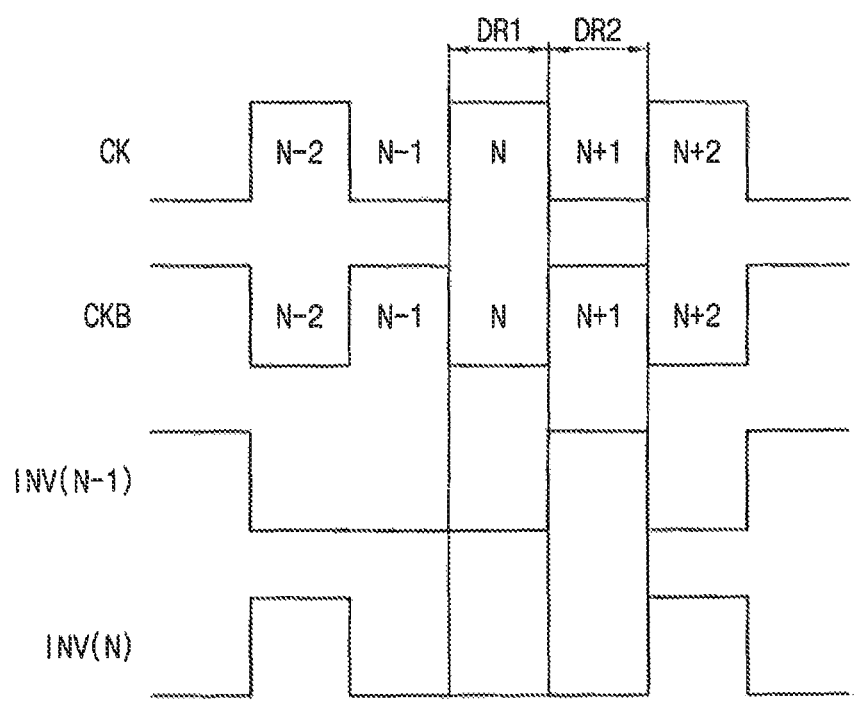

FIG. 3B is a circuit diagram illustrating another example of an N-th stage included in a gate driver according to an exemplary embodiment of the inventive concept. FIGS. 4A and 4B are timing diagrams illustrating input signals and output signals of an N-th stage included in a gate driver according to exemplary embodiments. Especially, FIG. 3B is a circuit diagram illustrating another example of the N-th stage included in the gate driver in FIG. 2, and FIGS. 4A and 4B are timing diagrams illustrating input signals and output signals in FIG. 3B.

In an embodiment, the timing controller 200 provides the first clock signal CK(N), the second clock signal CKB(N), the first off voltage VSS1, and the second off voltage VSS2 to the gate driver 300. In alternate embodiment, the timing controller 200 only provides the first clock signal and the gate driver 300 includes an additional inverter circuit to generate the second clock signal by passing the first clock signal through the inverter circuit.

Referring to FIGS. 1, 2, 3B, 4A and 4B, the N-th stage STN of the gate driver 300 receives a first clock signal CK(N), a first off voltage VSS1 and a second off voltage VSS2. The N-th stage outputs a gate signal GS(N).

The first clock signal CK(N) is applied to a first clock terminal. The first off voltage VSS1 is applied to a first off terminal. The second off voltage VSS2 is applied to a second off terminal. The gate signal GS(N) is outputted from a gate output terminal.

In an embodiment, the first clock signal CK(N) is a square wave having a high level and a low level that alternate. For example, the first clock signal CK(N) may have the high level during a first duration DR1 and may have the low level during a second duration DR2. In an embodiment, the high level of the first clock signal CK(N) is a gate-on voltage and the low level of the first clock signal CK(N) is a gate-off voltage. In an embodiment, the low level of the first clock signal CK(N) is substantially the same as the second off voltage VSS2. In an embodiment, a duty ratio of the high level of the first clock signal CK(N) is 50%. In an alternate embodiment, the duty ratio of the high level of the first clock signal CK(N) is less than 50%. The first clock signal CK(N) may be applied to the first clock terminal of odd stages or even stages of the gate driver 300. For example, the gate-on voltage may be about 15 V through 20 V.

In an embodiment, the second clock signal CKB(N) is a square wave having a high level and a low level that alternate. For example, the second clock signal CKB(N) may have the low level during the first duration DR1 and may have the high level during the second duration DR2. The high level of the second clock signal CKB(N) may be the gate-on voltage In an embodiment, the low level of the second clock signal CKB(N) is substantially the same as the second off voltage VSS2. In an embodiment, a duty ratio of the high level of the second clock signal CKB(N) is 50%. In an alternate embodiment, the duty ratio of the high level of the second clock signal CKB(N) is less than 50%. The second clock signal CKB(N) may be applied to the first clock terminal of odd stages or even stages of the gate driver 300. For example, when the first clock signal CK(N) is applied to the first clock terminal of the odd stages, the second clock signal CKB(N) is applied to the first clock terminal of the even stages. For example, when the first clock signal CK(N) is applied to the first clock terminal of the even stages, the second clock signal CKB(N) is applied to the first clock terminal of the odd stages. For example, the second clock signal CKB(N) may be the first clock signal CK(N) inverted. For example, the second clock signal CKB(N) may be generated by passing the first clock signal CK(N) through an inverter circuit.

In an embodiment, the first off voltage VSS1 is a DC voltage. In an embodiment, the second off voltage VSS2 is a DC voltage. In an embodiment, the second off voltage VSS2 has a lower level than the first off voltage VSS1. For example, the first off voltage VSS1 may be about −5 V. For example, the second off voltage VSS2 may be about −10 V.

The N-th stage STN outputs a gate signal GS(N) and an N-th carry signal CR(N) in response to an (N−1)-th carry signal CR(N−1) of an (N−1)-th stage that is a previous stage. The N-th stage STN pulls down the N-th gate signal GS(N) to the first off voltage VSS1 in response to an (N+1)-th carry signal CR(N+1) of an (N+1)-th stage that is a next stage.

Similarly, the first through N-th stages ST1~STN outputs each gate signal sequentially.

The (N−1)-th carry signal CR(N−1) is applied to an (N−1)-th carry terminal. The (N+1)-th carry signal CR(N+1) is applied to an (N+1)-th carry terminal. The N-th carry signal CR(N) is outputted from an N-th carry terminal.

The N-th stage STN includes a pull-up control part (e.g., a pull-up control circuit) 310, a charging part (e.g., a charging circuit) 320, a pull-up part (e.g., a pull-up circuit) 330, a carry part (e.g., a carry circuit) 340, an inverting part (e.g., an inverter or inverter circuit) 350, a first pull-down part (e.g., a first pull-down circuit) 361, a second pull-down part (e.g., a second pull-down circuit) 362, a carry stabilizing part (e.g., a carry stabilizing circuit) 370, a first holding part (e.g., a first holding circuit) 381, a second holding part (e.g., a second holding circuit) 382, a third holding part (e.g., a third holding circuit) 383 and a pull-down boosting part (e.g., a pull-down boosting circuit) 390.

The pull-up control part 310 includes a fourth transistor T4. The fourth transistor T4 includes a control electrode and an input electrode commonly connected to the (N−1)-th carry terminal, and an output electrode connected to a first node Q1. The first node Q1 is connected to a control electrode of the pull-up part 330.

The charging part 320 includes a charging capacitor C1. The charging capacitor C1 includes a first electrode connected to the first node Q1 and a second electrode connected to the gate output terminal.

The pull-up part 330 includes a first transistor T1. The first transistor T1 includes a control electrode connected to the first node Q1, an input electrode connected to a fifth node Q5 and an output electrode connected to the gate output terminal. The fifth node Q5 receives a first clock signal CK(N) from the first clock terminal.

The carry part 340 includes a fifteenth transistor T15 and a fourth capacitor C4. The fifteenth transistor T15 includes a control electrode connected to the first node Q1, an input electrode connected to the first clock terminal and an output electrode connected to the N-th carry terminal. The fourth capacitor C4 includes a first electrode connected to the first node Q1 and a second electrode connected to the N-th carry terminal.

The inverting part 350 includes a twelfth transistor T12, a seventh transistor T7, a thirteenth transistor T13, an eighth transistor T8, a second capacitor C2 and a third capacitor C3. The twelfth transistor T12 includes a control electrode and an input electrode commonly connected to the first clock terminal, and an output electrode connected to a fourth node Q4. The seventh transistor T7 includes a control electrode connected to the fourth node Q4, an input electrode connected to the first clock terminal and an output electrode connected to a third node Q3. The thirteenth transistor T13 includes a control electrode connected to the N-th carry terminal, an input electrode connected to the second off terminal and an output electrode connected to the fourth node Q4. The eighth transistor T8 includes a control electrode connected to the N-th carry terminal, an input electrode connected to the second off terminal and an output electrode connected to the third node Q3. An inverting signal INV(N) is output from a control output terminal that is connected to the output electrode of the eighth transistor T8. The second capacitor C2 includes a first electrode connected to the first clock terminal and a second electrode connected to the fourth node Q4. The third capacitor C3 includes a first electrode connected to the third node Q3 and a second electrode connected to the fourth node Q4.

Herein, the twelfth transistor T12 is a first inverting transistor. The seventh transistor T7 is a second inverting transistor. The thirteenth transistor T13 is a third inverting transistor. The eighth transistor T8 is a fourth inverting transistor.

The first pull-down part 361 includes a ninth transistor T9. The ninth transistor T9 includes a control electrode connected to the (N+1)-th carry terminal, an input electrode connected to the second off terminal and an output electrode connected to a second node Q2.

The second pull-down part 362 includes a second transistor T2. The second transistor T2 includes a control electrode connected to the (N+1)-th carry terminal, an input electrode connected to the first off terminal and an output electrode connected to the gate output terminal.

The carry stabilizing part 370 includes a seventeenth transistor T17. The seventeenth transistor T17 includes a control electrode and an input electrode commonly connected to the (N+1)-th carry terminal, and an output electrode connected to the N-th carry terminal.

The carry stabilizing part 370 reduces a noise due to a leakage current transmitted through a fourth transistor T4 of the (N+1)-th stage.

The first holding part 381 includes a tenth transistor T10. The tenth transistor T10 includes a control electrode connected to the third node Q3, an input electrode connected to the second off terminal and an output electrode connected to the first node Q1.

The second holding part 382 includes a third transistor T3. The third transistor T3 includes a control electrode connected to the third node Q3, an input electrode connected to the first off terminal and an output electrode connected to the gate output terminal.

The third holding part 383 includes an eleventh transistor T11. The eleventh transistor T11 includes a control electrode connected to the third node Q3, an input electrode connected to the second off terminal and an output electrode connected to the N-th carry terminal.

The pull-down boosting part 390 includes an eighteenth transistor T18. The eighteenth transistor T18 includes a control electrode connected to a second clock terminal receiving an inverting signal INV(N−1) output from a control output terminal of a previous stage, an input electrode connected to the second off terminal and an output electrode connected to the fifth node Q5. As shown in FIG. 4B, the inverting signal INV(N) output by the current stage is delayed from the inverting signal INV(N−1) output from a prior stage. The delay may be the same as the first duration DR1 or the second duration DR2. For example, the inverting signal INV(N−1) output from the prior stage may be the low level of the first clock signal CK(N) during the first duration DR1 and the high level of the first clock signal CK(N) during the second duration DR2.

In the present exemplary embodiment, although the (N−1)-th carry signal is used as a previous carry signal, the previous carry signal is not limited to the (N−1)-th carry signal. The previous carry signal may be a carry signal of any one of the previous stages. In addition, although the (N+1)-th carry signal is used as a next carry signal, the next carry signal is not limited to the (N+1)-th carry signal. The next carry signal may be a carry signal of any one of the next stages.

In an exemplary embodiment, the transistors are oxide semiconductor transistors. In an alternate embodiment, the transistors are amorphous silicon transistors.

A gate signal GS(N) of the N-th stage STN is synchronized with the first clock signal CK(N), and has a high level corresponding to the N-th stage STN. The N-th carry signal CR(N) is synchronized with the first clock signal CK(N), and has a high level corresponding to the N-th stage STN.

A voltage of the first node Q1 of the N-th stage STN is increased to a first level corresponding to the (N−1)-th stage by the pull-up control part 310. The voltage of the first node Q1 of the N-th stage STN is increased to a second level, which is higher than the first level, corresponding to the N-th stage STN by the pull-up part 330 and the charging part 320. The voltage of the first node Q1 of the N-th stage STN is decreased corresponding to the (N+1)-th stage by the first pull-down part 361.

For example, CR(N−1) input to the second stage ST2 is the CR(1) carry signal output by the first stage ST1, INV (N−1) input to the second stage ST2 is the INV(1) inverted signal output by the first stage ST1, and INV(N) output by the second stage is output to the third stage ST3.

At least one of the above described embodiments may be used in a display apparatus and/or a system including the display apparatus, such as a mobile phone, a smart phone, a personal digital assistant (PDA), a portable media player (PMP), a digital camera, a digital television, a set-top box, a music player, a portable game console, a navigation device, a personal computer (PC), a server computer, a workstation, a tablet computer, a laptop computer, a smart card, a printer, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the present inventive concept. Accordingly, all such modifications are intended to be included within the scope of the present inventive concept.

What is claimed is:

1. A gate driver comprising:
a pull-up-pull-down circuit configured to pull up a gate signal to a high level of a first clock signal in a first duration and configured to pull down the gate signal to a low level of the first clock signal in a second duration, wherein the first clock signal repeatedly alternates between the low level and the high level; and
a pull-down boosting circuit configured to output a first off voltage to a clock terminal receiving the first clock signal in the second duration in response to a second clock signal repeatedly alternating between the low level and the high level,
wherein the pull-up-pull-down circuit comprises a first transistor including a control electrode connected to a first node, an input electrode connected to the clock terminal and an output electrode connected to a gate terminal outputting the gate signal, and wherein the pull-down boosting circuit comprises an eighteenth transistor including a control electrode connected to a second clock terminal receiving the second clock signal repeatedly alternating between the low level and the high level, an input electrode directly connected to a first off terminal receiving the first off voltage and an output electrode constantly and directly connected to the clock terminal, wherein a level of the first off voltage is substantially the same as the low level of the first clock signal.

2. The gate driver of claim 1, wherein the first off voltage is a direct current DC voltage.

3. The gate driver of claim 1, wherein the second clock signal is the first clock signal inverted.

4. The gate driver of claim 1, further comprising:
a pull-up-pull-down control circuit configured to control an operation of the pull-up-pull-down circuit in response to a previous carry signal and a next carry signal,
wherein the pull-up-pull-down circuit, the pull-down boosting circuit, and the pull-up-pull-down control circuit form a current stage,
wherein the previous carry signal is output by a previous stage that is located before the current stage,
wherein the next carry signal is output by a next stage that is located after the current stage, and
wherein the previous stage and the next stage include the same elements as the current stage.

5. The gate driver of claim 4, wherein the pull-up-pull-down circuit comprises a first transistor, wherein a first control electrode of the first transistor is connected to the pull-up-pull-down control circuit, wherein a first input electrode of the first transistor is configured to receive the first clock signal, and wherein a first output electrode of the first transistor is configured to output the gate signal.

6. The gate driver of claim 5, wherein the pull-down boosting circuit comprises a second transistor, wherein a second control electrode of the second transistor is configured to receive the second clock signal, wherein a second input electrode of the second transistor is configured to receive the first off voltage, and a second output electrode of the second transistor is connected to the first input electrode.

7. The gate driver of claim 4, wherein the first off voltage is commonly applied to every stage.

8. The gate driver of claim 1, wherein the input electrode is directly connected to the first off terminal.

9. The gate driver of claim 1, further comprising a fourth transistor including a control electrode and an input electrode commonly connected to a previous carry signal.

10. The gate driver of claim 9, further comprising a ninth transistor including a control electrode connected to a next carry signal, an input electrode connected to a second off terminal receiving a second off voltage, and an output electrode connected to an output node of the fourth transistor.

11. A gate driver comprising:
a pull-up circuit configured to pull up a gate signal to a high level of a first clock signal in a first duration;
a pull-down circuit configured to pull down the gate signal to a first off voltage in a second duration in response to a next carry signal output by a next stage;
an inverting circuit configured to generate a current inverting signal based on the first clock signal and a second off voltage; and a pull-down boosting circuit configured to output the second off voltage to a clock terminal receiving the first clock signal that repeatedly alternates between a low level and the high level in the second duration in response to a previous inverting signal output by a previous stage,
wherein the pull-up circuit comprises a first transistor including a control electrode connected to a first node, an input electrode connected to the clock terminal, and an output electrode connected to a gate output terminal outputting the gate signal, and
wherein the pull-down boosting circuit comprises an eighteenth transistor including a control electrode connected to a previous inverting node receiving the previous inverting signal, an input electrode directly connected to a second off terminal receiving the second off voltage and an output electrode constantly and directly connected to the clock terminal,
wherein a level of the first off voltage is substantially the same as the low level of the first clock signal.

12. The gate driver of claim 11, wherein the second off voltage is a direct current DC voltage.

13. The gate driver of claim 11, wherein the inverting signal of the previous stage has a low level during the first duration and has a high level during the second duration.

14. A display apparatus comprising:
a data driver configured to generate a data voltage based on input image data;
a gate driver comprising:
a first transistor connected between a first clock terminal and a gate output terminal and comprising a first control electrode connected to a first node, a first input electrode connected to the first clock terminal and a first output electrode connected to the gate output terminal;
a fourth transistor connected between a previous carry terminal and the first node and comprising a fourth control electrode connected to the previous carry terminal;
a ninth transistor connected between the first node and a first off terminal and comprising a ninth control electrode connected to a next carry terminal;
a tenth transistor connected between the first node and the first off terminal and comprising a tenth control electrode connected to the first node; and
an eighteenth transistor connected between the first clock terminal and the first off terminal and comprising an eighteenth control electrode connected to an inversion terminal, an eighteenth input electrode directly connected to the first off terminal and an eighteenth output electrode constantly and directly connected to the first clock terminal; and
a display panel configured to display an image based on the data voltage and the gate signal,
wherein a first clock signal that repeatedly alternates between a low level and a high level is configured to be applied to the first clock terminal, a gate signal is configured to be output to the gate output terminal, a first off voltage is configured to be applied to the first off terminal, a previous carry signal is configured to be applied to the previous carry terminal, a next carry signal is configured to be applied to the next carry terminal, and an inversion signal is configured to be applied to the inversion terminal,
wherein the inversion signal has a low level during the first clock signal has a high level, wherein the eighteenth input electrode of the eighteenth transistor is connected to a ninth input electrode of the ninth transistor, wherein a level of the first off voltage is substantially the same as the low level of the first clock signal.

15. The display apparatus of claim 14, wherein the first off voltage is a direct current DC voltage.

16. The display apparatus of claim 14, wherein the inversion signal is the first clock signal inverted.

17. The display apparatus of claim 14, wherein the gate driver further comprises:
- a seventh transistor connected between the first clock terminal and the first node and comprising a seventh control electrode connected to a second node;
- an eighth transistor connected between the first node and the first off terminal and comprising an eighth control electrode connected to a current carry terminal;
- a twelfth transistor connected between the first clock terminal and the second node and comprising a twelfth control electrode connected to the first clock terminal;
- a thirteenth transistor connected between the second node and the first off terminal and comprising a thirteenth control electrode connected to the current carry terminal;
- a first capacitor connected between the first clock terminal and the second node; and a second capacitor connected between the first node and the second node, wherein a current carry signal is configured to be output to the current carry terminal.

18. The display apparatus of claim 14, wherein the gate driver further comprises:
- a second transistor connected between the gate output terminal and a second off terminal comprising a second control electrode connected to the next carry terminal.

19. The display apparatus of claim 14, wherein the first off voltage is commonly applied to every stage.

* * * * *